United States Patent [19]

Kimoto

[11] Patent Number: 4,905,240
[45] Date of Patent: Feb. 27, 1990

[54] SEMI-CUSTOM-MADE INTEGRATED CIRCUIT DEVICE

[75] Inventor: Manabu Kimoto, Tokyo, Japan
[73] Assignee: NEC Corporation, Japan
[21] Appl. No.: 113,553
[22] Filed: Oct. 26, 1987

[30] Foreign Application Priority Data

Oct. 27, 1986 [JP] Japan .................. 61-254981

[51] Int. Cl.⁴ .................. G01R 3/28; G06F 11/00
[52] U.S. Cl. .................................... 371/22.1
[58] Field of Search ................ 371/15, 25, 22.1; 324/73 R, 73 AT, 73 PC

[56] References Cited

U.S. PATENT DOCUMENTS

| | | | |
|---|---|---|---|
| 4,698,588 | 10/1987 | Hwang et al. | 371/25 |
| 4,701,920 | 10/1987 | Resnick et al. | 371/25 |
| 4,710,931 | 12/1987 | Bellay et al. | 371/25 |
| 4,710,933 | 12/1987 | Powell et al. | 371/25 |

Primary Examiner—Charles E. Atkinson
Attorney, Agent, or Firm—Laff, Whitesel, Conte & Saret

[57] ABSTRACT

In order to carry out a diagnostic operation after packaging process, there is disclosed a semi-custom-made integrated circuit device fabricated on a semiconductor substrate, comprising a plurality of function blocks each achieving a predetermined function and internal bus system operative to couple the function blocks, and one of the function blocks comprises a control signal generating circuit responsive to external control signals fed from the outside and operative to produce a plurality of internal control signals representing respective commands used for a diagnostic operation carried out on the basis of data information supplied from the outside of the semi-custom-made integrated circuit, so that the diagnostic operation can be carried out after packaging process with a set of information data commonly used among a plural-type of semi-custom-made integrated circuit device.

8 Claims, 6 Drawing Sheets

FIG. 1
PRIOR-ART

FIG. 2
PRIOR-ART

SEMI-CUSTOM-MADE INTEGRATED CIRCUIT DEVICE

FIELD OF THE INVENTION

This invention relates to a semi-custom-made integrated circuit device and, more particularly, to a semi-custom-made large-scale integration with self-diagnostic function.

BACKGROUND OF THE INVENTION

Recently, a large-scale integrated (LSI) circuit device such as, for example, a microcomputer or a semiconductor memory device finds wide variety of practical applications for its productivity and small occupation space. However, in this situation, it is not enough to build up a practical system by using only standard-type large-scale integrated circuit devices represented by the microcomputer and the semiconductor memory device. Then, custom-made large-scale integrated circuit devices are provided to establish a high-performance system. The custom-made large-scale integrated circuit devices are classified into two groups one of which is called as a full-custom-made large-scale integrated circuit device and the other of which is called as a semi-custom-made large-scale integrated circuit device. The full-custom-made large-scale integrated circuit device is beneficial to a consumer product of the mass-produced type, and the semi-custom-made large-scale integrated circuit device is located between the standard-type large-scale integrated circuit device and the full-custom-made large-scale integrated circuit device and is widely used. The wider it is used, the higher efficiency the user demands to the semi-custom-made large-scale integrated circuit device.

One of the approaches to achieve a higher efficiency appears to be the development of a macro-cell type large-scale integration. The macro-cell type large-scale integration is different from a logic gate array but is fabricated on a semiconductor substrate with function blocks each equivalent in function to a standard type semiconductor integrated circuit device. According to the fabrication process of the macro-cell type large-scale integration, a plurality of function blocks selected from a macro-cell library have been formed with the most appropriate circuit arrangements which in turn have been transferred to the mask layouts. The function block thus prepared without limitation of time occupies a relatively small amount of area on the semiconductor substrate so that the macro-cell type large-scale integration is advantageous in integration density over the logic gate array.

Figure 1:
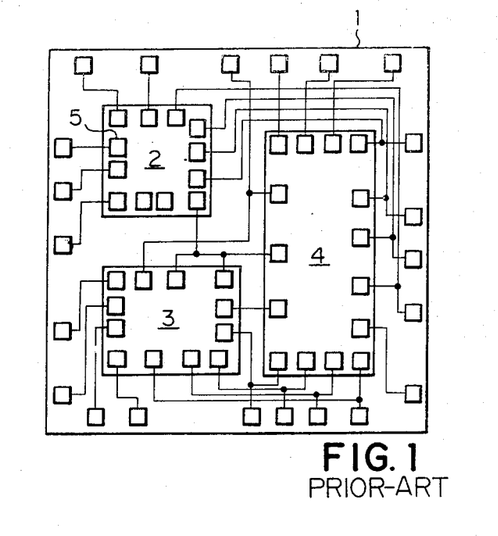
FIG. 1 is a block diagram showing the circuit arrangement of a prior-art macro-cell type large-scale integrated circuit device.

One of the goals in development of the macro-cell type large-scale integration is to establish a diagnostic method after integration process. A typical diagnostic technique is carried out by applying a macro-cell type large-scale integration with a test pattern consisting of a string of binary bits from an analyzer through its testing probes. In detail, FIG. 1 shows a typical example of the macro-cell type large-scale integrated circuit fabricated on a semiconductor substrate 1. The macro-cell type large-scale integrated circuit comprises three function blocks 2, 3 and 4 and each of the function blocks 2, 3 and 4 has a circuit arrangement to achieve a predetermined function and a plurality of probe pads or, alternatively, a plurality of bonding pads one of which is designated by reference numeral 5. The probe pads or the bonding pads are selectively coupled by metal wirings to form a large-scale integrated circuit and the large-scale integrated circuit with the metal wirings is packed into a case ( which is not shown in the drawings ). For diagnosis of the function blocks, the probes are attached to the probe pads or the bonding pads and the respective test patterns are supplied from the analyzer to the function blocks through the probes. However, a problem is encountered in the prior-art diagnostic technique in limited opportunity. Namely, the diagnosis is carried out under directly contacting the probes to the probe pads of the macro-cell type large-scale integrated circuit, then the testing opportunity is limited to a stage before the packaging. However, the macro-cell type large-scale integrated circuit is liable to be subjected to a heat stress and a mechanical stress during the packaging process and, for this reason, some macro-cell type large-scale integrated circuits are deteriorated in characteristics even if no problem is found in the diagnostic operation. Moreover, the diagnostic technique described above has another problem in deterioration of integration density. This is because of the fact that the diagnostic technique requests a plurality of probe pads each having an area sufficient to receive the probe of the analyzer. A large amount of area is consumed by probe pads as shown in FIG. 1 so that the number of transistors formed on the semiconductor substrate is restricted due to a narrow area available for formation.

Figure 2:
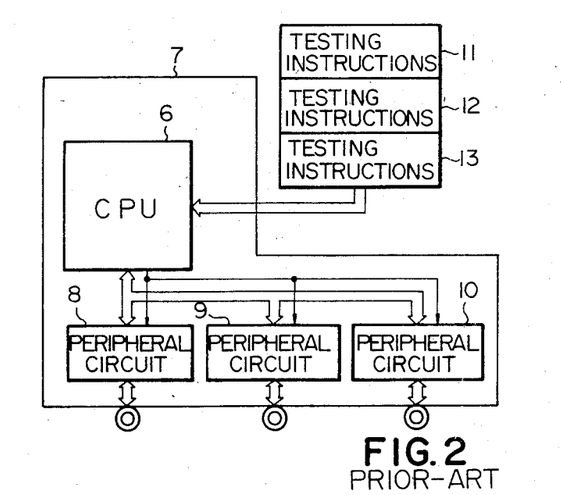
FIG. 2 is a block diagram showing the circuit arrangement of another prior-art macro-cell type large-scale integrated circuit device.

Another diagnostic technique is carried out by using a function block 6 performing as a central processing unit ( CPU ). Referring to FIG. 2 of the drawings, there is shown another prior-art macro-cell type large-scale integration fabricated on a semiconductor substrate 7. The macro-cell type large-scale integrated circuit illustrated in FIG. 2 further comprises three function blocks 8, 9 and 10 which serve as peripheral circuits of the central processing unit. The function block 6 is coupled to the function blocks 8, 9 and 10 by a plurality of metal wirings so that the function block 6 serving as the central processing unit can control the function blocks 8, 9 and 10 serving as the peripheral circuits based on programmed instructions fed from the outside. The programmed instructions include testing instructions 11 for the function block 8, testing instructions 12 for the function block 9 and testing instructions 13 for the function block 10. When a diagnostic operation starts, the testing instructions 11 for the function block 8 are fed from the outside to the function block 6 and the function block 6 produces a test pattern consisting of a string of binary bits which are applied to the function block 8 so as to diagnose whether or not the function block 8 achieves a predetermined function. Upon accomplishment of the diagnosis for the function block 8, the testing instructions 12 are fed to the function block 6 and the function block 6 produces a test pattern consisting of a string of binary bits for the diagnostic operation for the function block 9. In this manner, diagnostic operations are carried out for all of the function blocks serving as the peripheral circuits. This diagnostic technique provides a solution of the problem inherent in the diagnostic technique described with reference to FIG. 1 because the testing instructions 11, 12 and 13 can be fed from the outside through an input-output port even if the macro-cell large-scale integrated circuit is packed into a case. However, another problem is encountered in the diagnostic technique described with reference to FIG. 2 of the drawings in preparing a large number of testing instructions fed from the outside to the function block serving as a central processing unit. Namely, the macro-cell type large-scale integrated circuit has a variety of function blocks each serving as a central processing unit different in type from that employed in the other macro-cell type integrated circuit device. If the central processing unit is different in type, the instruction codes are also different from those of another central processing unit. As a result, the number of testing instructions TI needed is calculated by the following:

$$TI = CPU \times PHC$$

where CPU is the number of the central processing unit types and the PHC is the number of the peripheral circuit types.

SUMMARY OF THE INVENTION

It is therefore an important object of the present invention to provide a semi-custom-made integrated circuit device which is free from the problems inherent in the prior-art techniques.

It is another important object of the present invention to provide a semi-custom-made integrated circuit device which has a self-diagnostic function.

It is still another important object of the present invention to provide a semi-custom-made integrated circuit device which has a self-diagnostic function carried out after the packaging process.

It is still another important object of the present invention to provide a semi-custom-made integrated circuit device which has a higher integration density.

It is still another important object of the present invention to provide a semi-custom-made integrated circuit device which is achieved by one of the function blocks.

It is still another important object of the present invention to provide a semi-custom-made integrated circuit device which has a function blocks dedicated to a diagnostic operation.

It is still another important object of the present invention to provide a semi-custom-made integrated circuit device which has a function block dedicated to a diagnostic operation and operative to produce test patterns on the basis of the pieces of data information supplied from the outside thereof.

To accomplish these objects, the present invention proposes to form a function block operative to produce control signals on the basis of an information supplied from the outside and causing another function, block to carry out a diagnostic operation with pieces of data information.

In accordance with the present invention, there is provided an integrated circuit device fabricated on a semiconductor substrate, comprising a plurality of function blocks each achieving a predetermined function and an internal bus system operative to couple the function blocks, wherein one of the function blocks comprises a control signal generating circuit responsive to external control signals fed from the outside of the integrated circuit device and operative to produce a plurality of internal control signals representing respective commands used for a diagnostic operation carried out on the basis of data information supplied from the outside of the integrated circuit device.

The control signal generating circuit may produce a first internal control signal which activates a circuit forming a part of another function block specified by one of the data informations, a second internal control signal which causes the activated circuit to store another data information appearing on the internal bus system, and a third internal control signal which allows the activated circuit to deliver a data information to the internal bus system. The function block with the control signal generating circuit may further have an input-output circuit operative to transfer the data information to the internal bus system but the input-output circuit may be included in another function block.

BRIEF DESCRIPTION OF THE DRAWINGS

The features and advantages of a semi-custom-made integrated circuit device according to the present invention will be more clearly understood from the following description taken in conjunction with the accompanying drawings in which.

DESCRIPTION OF THE PREFERRED EMBODIMENTS

First Embodiment

Figure 3:
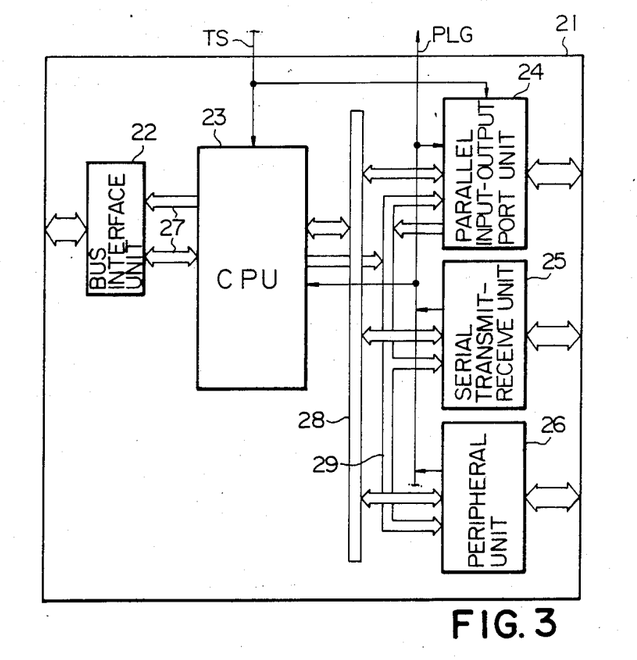
FIG. 3 is a block diagram showing the circuit arrangement of a semi-custom-made integrated circuit device embodying the present invention.

Referring to FIG. 3 of the drawings, there is illustrated a semi-custom-made integrated circuit device of the macro-cell type. In general, the semi-custom-made integrated circuit device comprises a plurality of function blocks which can be classified into two groups one of which is called as a standard type macro-cell and the other of which is called as a custom-made type macro-cell. The function block of the standard type macro-cell has been arranged to have the most appropriate circuit arrangement regardless of customer's specification and, for this reason, the circuit arrangement is common to all applications. On the other hand, the function block of the custom-made type macro-cell is arranged on the basis of the customer's specification so that the circuit arrangement may be different from that of another application. However, the semi-custom-made integrated circuit device can be formed by only function blocks selected from the standard type macro-cell library. The semi-custom-made integrated circuit device illustrated in FIG. 3 comprises a plurality of function blocks of the standard type and is fabricated on a semiconductor substrate 21. Though not shown in the drawings, the semi-custom-made integrated circuit illustrated in FIG. 3 is packed in a case. The semi-custom-made integrated circuit device has more than five function blocks however only five of them are illustrated and designated by reference numerals 22, 23, 24, 25 and 26. The function block 22 serves as a bus interface unit and coupled to an external multibit bus system ( not shown ). The function block 22 is further coupled to the function block 23 through a first internal bus system 27 which propagates a data signal and an address signal to the function block 23 and the function block 23 serves as a central processing unit ( CPU ). The function block 23 has a control terminal supplied with a test signal TS which is supplied in parallel to one of control terminals of the function block 24. In order to communicate with the other function blocks including the function blocks 24, 25 and 26, an internal multi-bit bus system 28 and a control bus system 29 are provided on the substrate 21. Complementary clock signals CLK1 and CLK2 are supplied from the function block 23 to the other function blocks 24, 25 and 26.

Figure 4:
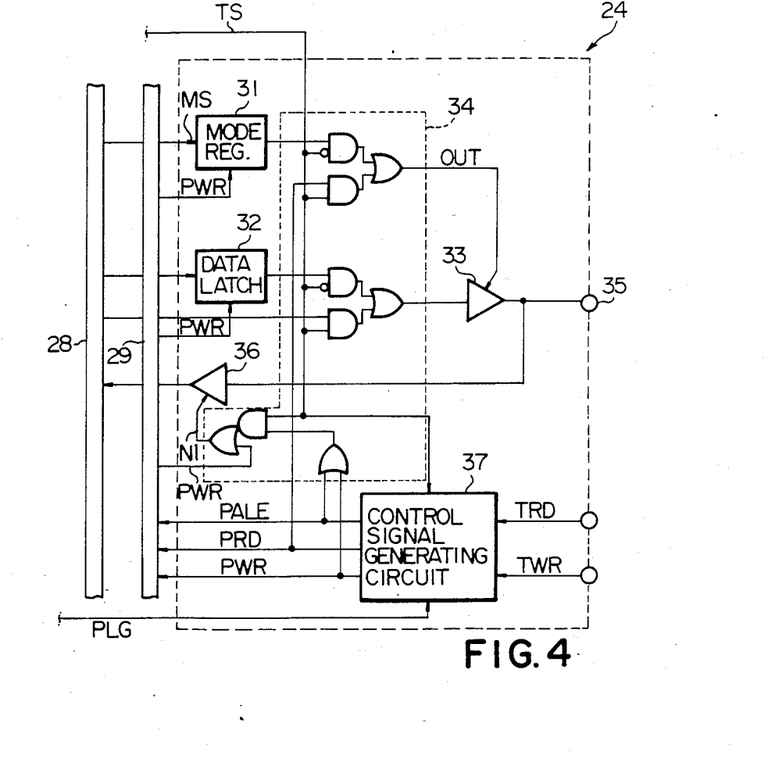
FIG. 4 is a block diagram showing the circuit arrangement of a parallel input-output port unit incorporated in the semi-custom-made integrated circuit device illustrated in FIG. 3.

The function block 24 serves as a parallel input-output port unit and a part of the circuit arrangement is illustrated in detail in FIG. 4. The function block 24 is operative to transfer a piece of multi-bit information from the internal bus system 27 to an external multi-bit bus system ( not shown ) and vice versa, however FIG. 4 illustrates a part of the circuit arrangement for only one bit of the information. In FIG. 4, reference numeral 31 designates a mode register which is operative to store a mode signal MS fed from the function block 23 in the presence of a write control signal PWR from the function block 23 and the mode signal MS represents an input mode or an output mode of the function block 24. A bit of data information appearing on the internal multi-bit bus system 28 is latched by a data latch circuit 32 in the presence of the write control signal PWR fed from the function block 23 and the bit of data information is transferred to the output buffer circuit 33 under the control of a control circuit 34. In detail, when no test signal TS is supplied to the control circuit 34, the control circuit 34 is under the direct control of the function block 23. Then, the bit of data information stored in the data latch circuit 32 is transferred to the output buffer circuit 33 when the mode register 31 have the mode signal MS representing the output mode in the absence of the test signal TS. The bit of data information in turn is transferred from the output buffer circuit 33 to an input-output terminal 35 which forms a part of an input-output port in response to an output buffer activation signal OUT fed from the control circuit 34. The input-output terminal 35 is further coupled to an input buffer circuit 36 which in turn is coupled to the internal multi-bit bus system 28. The input buffer circuit 36 is operative to transfer a bit of data information supplied from the outside in response to an input buffer activation signal IN fed from the control circuit 34 when the write control signal PWR appears in the absence of the test signal TS.

The circuit illustrated in FIG. 4 further comprises a control signal generating circuit 37 and the control signal generating circuit 37 is activated in the presence of the test signal TS. When the test signal TS is supplied from the outside, the control circuit 34 leaves from the control of the function block 23 and comes under the control of the control signal generating circuit 37. The control signal generating circuit 37 is supplied with two external control signals TRD and TWR and produces three internal control signals PALE, PRD and PWR. Upon activation, the control signal generating circuit 37 produces the internal control signal PALE and the internal control signal PWR in succession in response to the external control signal TWR and further produces the internal control signal PALE and the internal control signal PRD in succession in response to the external control signal TRD. When the control signal PALE is fed to the control bus system 29, a circuit specified by data information a bit of which appears at the input-output terminal 35 is activated. The circuit specified by the data information is operative to store a data information supplied from the outside in response to the control signal TWR and to deliver data information stored therein in response to the control signal TRD.

Figure 5:
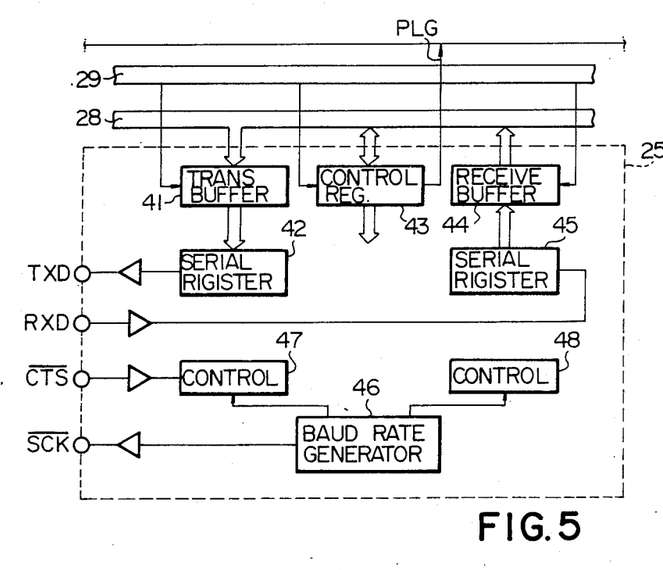
FIG. 5 is a block diagram showing the circuit arrangement of a serial transmit-receive unit incorporated in the semi-custom-made integrated circuit device illustrated in FIG. 3.

Turning to FIG. 5 of the drawings, the circuit arrangement of the function block 25 is shown. The function block 25 serves as a serial transmit-receive unit and comprises a transmitting buffer circuit 41, a transmitting serial register 42, a control register 43, a receiving buffer circuit 44, a receiving serial register 45, a baud rate generator 46, a transmitting controller 47 and a receiving controller 48. Each of the transmitting buffer circuit 41 and the receiving buffer circuit 44 is addressed by data information representing an address. The transmitting buffer circuit 41 is coupled to the internal multi-bit bus system 28 so that a data information fed thereto is stored in the transmitting buffer circuit 41 in response to the control signal PWR. On the other hand, the receiving buffer circuit 44 intervenes between the receiving serial register 45 and the internal multi-bit bus system 28 so that the data information stored in the receiving serial register 45 is read out through the receiving buffer circuit 44 to the internal multi-bit bus system 28 in response to the control signal PRD. The control register 43 produces a plurality of control signals used in the function block 25, but when the control signal PRD is supplied from the function block 24, the control register 43 produces an elongation signal PLG which causes the control signal generating circuit 37 to elongate the time period of the active level of the control signal PRD.

Figure 6:
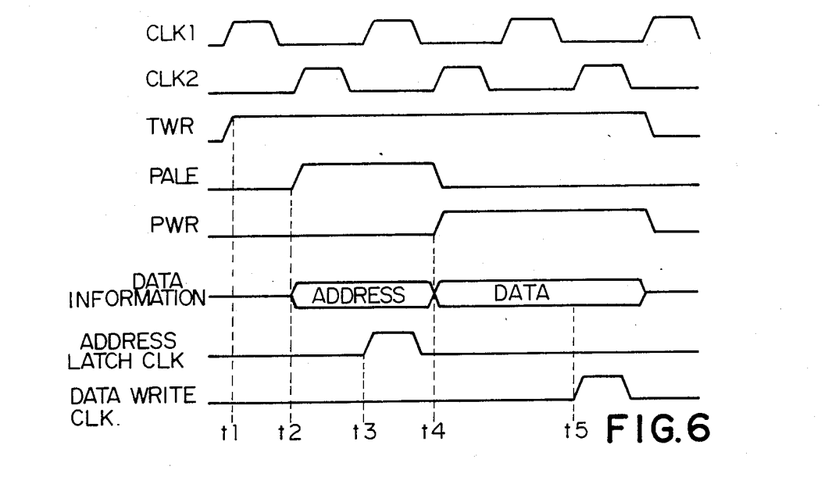
FIG. 6 is a diagram showing the waveforms of signals appearing at respective nodes of the units illustrated in FIGS. 4 and 5.
Figure 7:
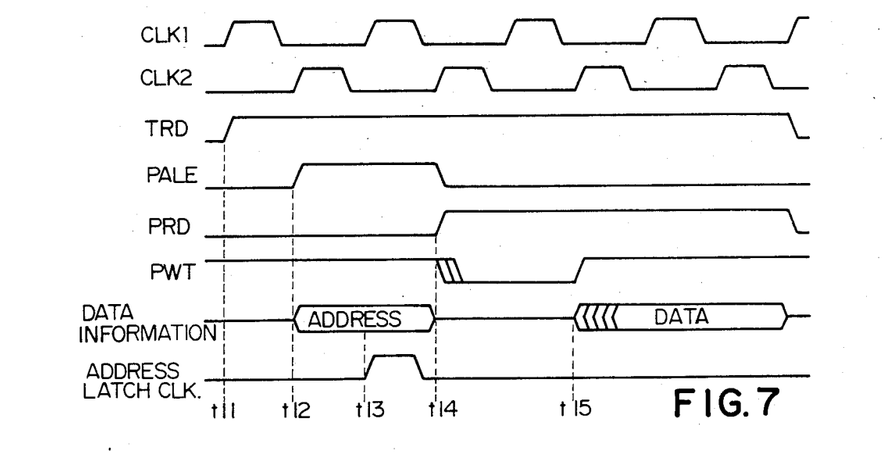
FIG. 7 is a diagram showing the waveforms of signals appearing in an operation different from that related to FIG. 6.

Description will be made for diagnostic operations with reference to FIGS. 6 and 7. Referring to FIG. 6, there is shown the waveforms appearing in the semi-custom-made integrated circuit illustrated in FIG. 3. When the test signal TS is fed from the outside, the control circuit 34 comes under the control of the control signal generating circuit 37. In this situation, assuming now that the external signal TWR is fed from the outside to the control signal generating circuit 37 at time t1 and that data information representing an address specifying the transmitting buffer circuit 41 appears at the input-output port thereof at time t2, the control signal generating circuit 37 produces the internal control signal PALE which is transferred to the control bus system 29 and, then, causes the control circuit 34 to produce the input buffer activation signal IN. With the input buffer activation signal IN, the input buffer circuit 36 fetches the data information appearing at the input-output port and transfers the data information to the internal multi-bit bus system 28. The control register 43 produces an address latch clock in response to the internal control signal PALE and latches the data information representing the address specifying the transmitting buffer circuit 41 at time t3 and. Subsequently, the control signal generating circuit 37 produces the internal control signal PWR and causes the control circuit 34 to activate the input buffer circuit 36 at time t4. Another data information is supplied to the input-output port, then the input buffer circuit 36 fetches the data information and transfers it to the internal multi-bit bus system 28. When the internal control signal PWR is fetched by the control register 43, the control register 43 produces a data write clock ( time t5 ) which is fed to the transmitting buffer circuit 41. Then, the data information appearing at the internal multi-bit bus system 28 is stored in the transmitting buffer circuit 41. Thus, the data information fed from the outside is stored in the transmitting buffer circuit 41 so that the transmitting buffer circuit 41 is diagnosed depending upon the result of the above operation.

On the other hand, a read-out operation is tested as follows. Assuming now that the external control signal TRD is supplied from the outside to the control signal generating circuit 37 at time t11 and that a data information representing an address of the receiving buffer circuit 44 appears at the input-output port at time t12, the control signal generating circuit 37 causes the control circuit 34 to send the input buffer activation signal IN to the input buffer circuit 36. Then, the data information is fetched by the input buffer circuit 36 and transferred to the internal multi-bit bus system 28. With the internal control signal PALE, the control register 43 produces the address latch signal and latches the data information representing the address specifying the receiving buffer circuit 44 at time t13. Subsequently, the control signal generating circuit 37 produces the internal control signal PRD, then data information is transferred from the receiving serial register 45 to the receiving buffer circuit 44. Simultaneously, the control register 43 produces the elongation signal PLG so that the internal control signal PRD continues for one more clock period. After transferring the data information from the receiving serial register 45 to the receiving buffer circuit 44, the data information in turn is transferred from the receiving buffer circuit 44 to the internal multi-bit bus system 28. Then, the receiving buffer circuit 44 is diagnosed on the basis of the result of the above operation.

Second Embodiment

Figure 8:
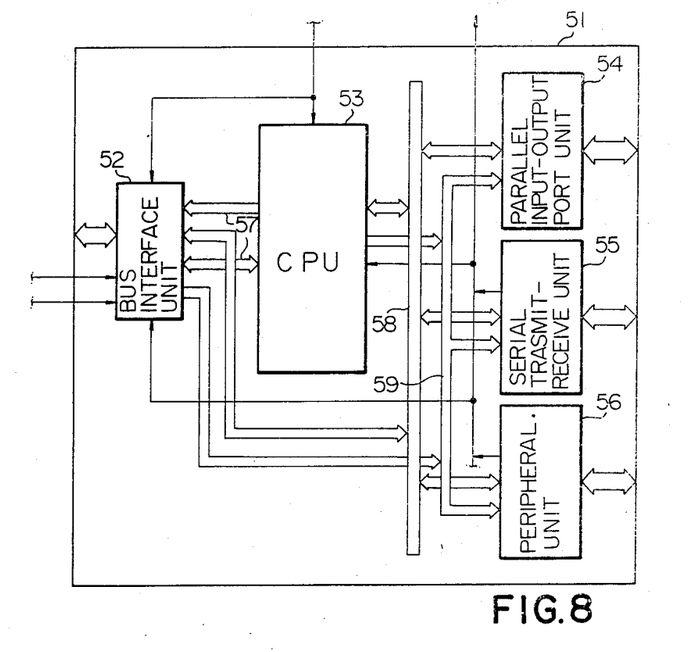
FIG. 8 is a diagram showing the circuit arrangement of another semi-custom-made integrated circuit device embodying the present invention.

Turning to FIG. 8 of the drawings, the circuit arrangement of another semi-custom-made integrated circuit embodying the present invention. The semi-custom-made integrated circuit device illustrated in FIG. 8 is fabricated on a semiconductor substrate 51 and packed in a case ( not shown ). The semi-custom-made integrated circuit device has more than five function blocks however only five of them are illustrated and designated by reference numerals 52, 53, 54, 55 and 56. The function block 52 serves as a bus interface unit and coupled to an external multi-bit bus system ( not shown ). The function block 52 is further coupled to the function block 53 through a first internal bus system 57 which propagates a data signal and an address signal to the function block 53. The function block 53 serves as a central processing unit ( CPU ). The function block 23 has a control terminal supplied with a test signal TS which is supplied in parallel to one of control terminals of the function block 52. In order to communicate with the other function blocks 52 to 56, an internal multi-bit bus system 58 and a control bus system 59 are provided on the substrate 51. In this instance, a control signal generating circuit corresponding to the circuit 37 is formed in the function block 52 so that an input-output port is shared between the control signal generating circuit and the function block 53.

As will be understood from the foregoing description, the semi-custom-made integrated circuit device according to the present invention has a self-diagnostic function carried out after packaging process,, so that inferior goods are perfectly eliminated. The pieces of data information is supplied from the outside through the input-output port, then integration density is not degraded because bonding pads need not have a wide area. Moreover, the control signal generating circuit produces the internal control signal, so that only one group of pieces of data information is sufficient to carry out the diagnostic operation. The control signal generating circuit provides the internal control signals to a plurality of function blocks so that all of the function blocks do not need the respective testing circuits. This is because of the fact that the control signal generating circuit produces the internal control signal regardless of the type of the central processing unit.

Although particular embodiment of the present invention have been shown and described, it will be obvious to those skilled in the art that various changes and modifications may be made without departing from the spirit and scope of the present invention.

What is claimed is:

1. An integrated circuit device fabricated on a semiconductor substrate, said device comprising a plurality of function blocks each achieving a predetermined function and an internal bus system which is operative to couple said function blocks, wherein one of said function blocks comprises a control signal generating circuit responsive to external control signals fed from outside said integrated circuit device and operative to produce a plurality of internal control signals representing respective commands used for a diagnostic operation for another function block, said diagnostic operation being carried out on the basis of pieces of data information, and an input-output circuit which is operative to transfer said pieces of data information supplied from outside said integrated circuit device through said internal bus system to another function block.

2. An integrated circuit device as set forth in claim 1, in which said control signal generating circuit produces a first internal control signal which activates a circuit forming a part of said another function block specified by one of said pieces of data information.

3. An integrated circuit device as set forth in claim 2, in which said control signal generating circuit further produces a second internal control signal which causes a said circuit to store another piece of said data information appearing on said internal bus system.

4. An integrated circuit device as set forth in claim 2, in which said control signal generating circuit further produces a third internal control signal which enables said circuit to deliver a piece of data information to said internal bus system.

5. An integrated circuit device set forth in claim 1, in which said another function block comprises an input-output circuit operative to transfer said pieces of said data information supplied from outside said integrated circuit device to said internal bus system.

6. An integrated circuit device as set forth in claim 5, in which said one of said function block further comprises a bus interface unit.

7. An integrated circuit device fabricated on a semiconductor substrate, said device comprising a plurality of function blocks each achieving a predetermined function and internal bus system operative to couple said function blocks, wherein one of said function blocks comprises an input-output circuit which is operative to transfer pieces of data information supplied from outside said integrated circuit device to said internal bus system, and a control signal generating circuit responsive to external control signals fed from outside said integrated circuit device and operative to produce a first internal control signal which activates a circuit forming a part of another function block identified by one of said pieces of said data information, a second internal control signal which causes said circuit to store another piece of said data information appearing on said internal bus system and a third internal control signal which enables said circuit to deliver a piece of data information to said internal bus system.

8. An integrated circuit device fabricated on a semiconductor substrate, said device comprising a plurality of function blocks each achieving a predetermined function and an internal bus system operative to coupled said function blocks, in which one of said function blocks comprises an input-output circuit which is operative to transfer pieces of data information supplied from outside said integrated circuit device to said internal bus system, and a control signal generating circuit responsive to external control signals fed from outside said integrated circuit device and operative to produce a plurality of internal control signals representing respective commands used for a diagnostic operation for another function block, said diagnostic operation being carried out on the basis of said pieces of said data information supplied from outside said integrated circuit device, said external control signal having a test signal for activation of said control signal generating circuit and enabling said input-output circuit to transfer said pieces of said data information to said internal bus system for said diagnostic operation, a write-in command signal and a read-out command signal, said internal control signals having an activation signal which is used for activating at least two circuits forming part of said another function block each specified by one of said pieces of said data information, a write-in enable signal used for causing one of said circuits of said another function block to store another piece of said data information appearing on said internal bus system and a read-out enable signal used for enabling the other of said circuits to deliver a piece of data information to said internal bus system, wherein said at least two circuits of said another function block serve as a transmitting buffer circuit and a receiving buffer circuit, respectively.

* * * * *